United States Patent
Lai

(10) Patent No.: US 8,421,174 B2
(45) Date of Patent: Apr. 16, 2013

(54) LIGHT EMITTING DIODE PACKAGE STRUCTURE

(75) Inventor: Kuang-Chu Lai, New Taipei (TW)

(73) Assignee: Liang Meng Plastic Share Co., Ltd., New Taipei (TW)

( * ) Notice: Subject to any disclaimer, the term of this patent is extended or adjusted under 35 U.S.C. 154(b) by 117 days.

(21) Appl. No.: 13/084,947

(22) Filed: Apr. 12, 2011

(65) Prior Publication Data
US 2012/0037927 A1      Feb. 16, 2012

(30) Foreign Application Priority Data
Aug. 16, 2010 (TW) ................ 99215742 U

(51) Int. Cl.
*H01L 33/00* (2010.01)
(52) U.S. Cl. ............. 257/433; 257/88; 257/99; 257/686
(58) Field of Classification Search .............. 257/88–89, 257/98–99, 431–448, 686, E33.067
See application file for complete search history.

(56) References Cited

U.S. PATENT DOCUMENTS

| | | | |
|---|---|---|---|
| 7,538,356 B2 * | 5/2009 | Lai | 257/88 |
| 2010/0072496 A1 * | 3/2010 | Kobayakawa | 257/91 |

* cited by examiner

*Primary Examiner* — Tran Tran
(74) *Attorney, Agent, or Firm* — Chun-Ming Shih; HDLS IPR Services

(57) ABSTRACT

A light emitting diode package structure includes a substrate (10), LED bare chips (20) and a lens (30). The substrate (10) has an upper surface (11), a lower surface (12) and a side surface (13) between the upper surface (11) and the lower surface (12). The upper surface (11) is provided with a circuit pattern (111). The side surface (13) is provided with a groove (131). The LED bare chips (20) are fixed on the upper surface (11) and electrically connected with the circuit pattern (111). The lens (30) covers the LED bare chips (20), the upper surface (11) and the circuit pattern (111) by an injection molding process so as to be inserted into the groove (131). With this arrangement, the connecting strength between the substrate (10) and the lens (30) can be enhanced, thereby achieving waterproof and anti-electrostatic effects. Further, material cost of the present invention is reduced greatly.

8 Claims, 3 Drawing Sheets

US 8,421,174 B2

LIGHT EMITTING DIODE PACKAGE STRUCTURE

BACKGROUND OF THE INVENTION

1. Field of the Invention

The present invention relates to an illumination device, in particular to a light emitting diode package structure.

2. Description of Prior Art

Since light emitting diodes (referred to as "LED" hereinafter) are energy-saving, they have become a new-generation light source for replacing traditional bulbs. Currently, LEDs have been widely used in indoor or outdoor illumination.

A conventional light emitting diode package structure is proposed, in which an upper surface of a substrate is provided with an annular groove. A LED chip is mounted on the surface of substrate on which the annular groove is formed. A binder made of silicon materials is filled into the groove, and then a lens covers outside the LED chip. The bottom of the lens is embedded into the groove and combined therewith.

However, the conventional light emitting diode package structure merely allows one LED chip to be mounted thereon. When a plurality of LED chips are to be mounted on the same substrate, the steps of forming a groove on the substrate, filling the binder in the groove and covering the lens have to be performed for the LED chips respectively. As a result, the manufacturing time and cost cannot be reduced. On the other hand, in such a package structure, the binder is used to connect the substrate and the lens. However, the lens is formed into a thin shell with a less connecting strength, so that the lens may be disconnected from the substrate easily. Further, the conventional package structure does not have waterproof and anti-electrostatic effects, and thus really needs to be improved.

SUMMARY OF THE INVENTION

The present invention is to provide a light emitting diode package structure, in which a lens is inserted into or engaged with a substrate to thereby enhance the connecting strength therebetween. Thus, the present invention has waterproof and anti-electrostatic effects.

The present invention is to provide a light emitting diode package structure, including a substrate, a plurality of LED bare chips and a lens. The substrate has an upper surface, a lower surface and a side surface between the upper surface and the lower surface. The upper surface is provided with a circuit pattern, and the side surface is provided with a groove. The LED bare chips are fixed on the upper surface and electrically connected with the circuit pattern. The lens covers the LED bare chips, the upper surface and the circuit pattern by means of an injection molding process so as to be inserted into the groove.

The present invention is to provide a light emitting diode package structure, including a substrate, a plurality of LED bare chips and a lens. The substrate has an upper surface, a lower surface and a side surface between the upper surface and the lower surface. The upper surface is provided with a circuit pattern, and the side surface is provided with a flange. The LED bare chips are fixed on the upper surface and electrically connected with the circuit pattern. The lens covers the LED bare chips the upper surface and the circuit pattern by means of an injection molding process so as to be engaged with the flange.

The present invention has the following advantageous features. The first lens covering the surface of the LED bare chip can be omitted, thereby reducing the material cost greatly.

DETAILED DESCRIPTION OF THE INVENTION

The detailed description and technical contents of the present invention will become apparent with the following detailed description accompanied with related drawings. It is noteworthy to point out that the drawings is provided for the illustration purpose only, but not intended for limiting the scope of the present invention.

Figure 1:
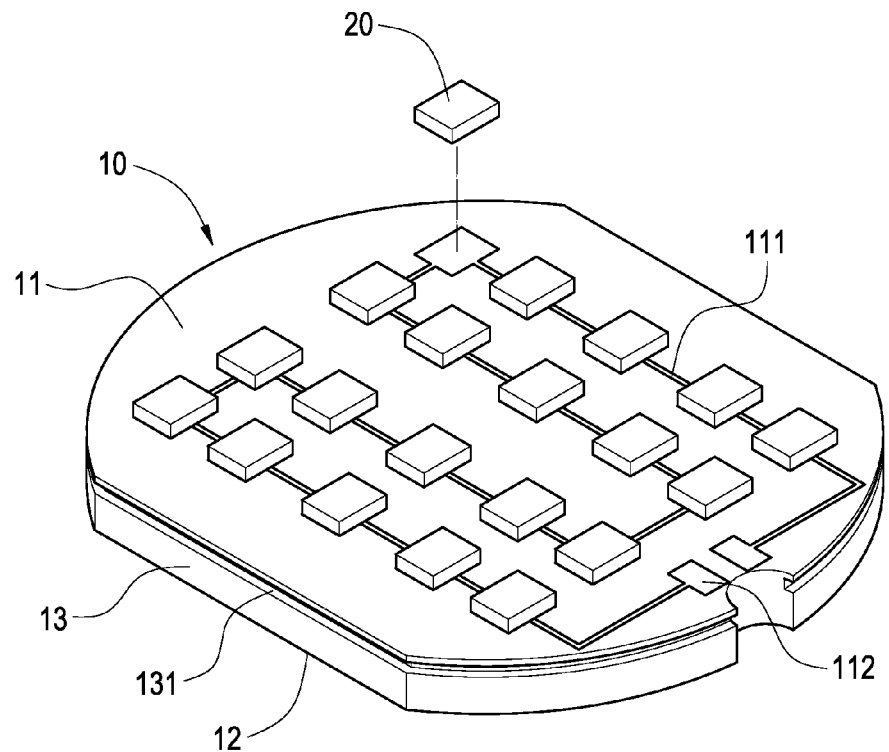
FIG. 1 is a perspective view of the present invention showing respective bare chips being mounted on the substrate.
Figure 2:
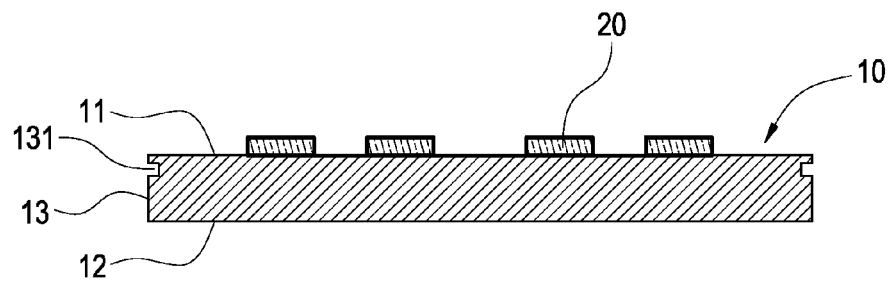
FIG. 2 is an assembled cross-sectional view of FIG. 1.

Please refer to FIGS. 1 and 2. The present invention provides a light emitting diode package structure including a substrate 10, a plurality of LED bare chips 20 and a lens 30.

The substrate 10 is made of metallic materials having good heat conductivity such as aluminum, copper or alloys thereof. The substrate 10 is formed into a capsule shape and has an upper surface 11, a lower surface 12 and a side surface 13. The lower surface 12 is located below the upper surface 11. The side surface 13 is formed vertically between the upper surface 11 and the lower surface 12. The upper surface 11 is provided with a circuit pattern 111. Copper clad circuit on the circuit pattern 111 is combined with the upper surface 11 in an electrically insulating manner. The first and last ends of the circuit pattern 111 are formed with an electrical conductive contact 112 respectively. Similarly, after the circuit pattern 111 is made completely, the circuit pattern 111 is fixedly bonded on the upper surface 11. The side surface 13 is provided with an annular groove 131 surrounding the profile of the substrate 10. The cross section of the groove 131 may be formed into any one of a rectangular shape, a trapezoid shape, a V shape, a semicircular shape, a dovetailed shape, a triangular shape and other suitable shapes.

The LED bare chips 20 are respectively arranged on the upper surface 11 of the substrate 10 at intervals based on the traces of the circuit pattern 111. The electrodes (not shown) of the LED bare chip 20 are electrically connected in series with the copper clad circuit of the circuit pattern 111. In the present embodiment, although the respective LED bare chips 20 are electrically connected in series with each other, the electrical connection between the LED bare chips 20 is not limited to a serial connection only, but other forms of electrical connections may be used.

Figure 3:
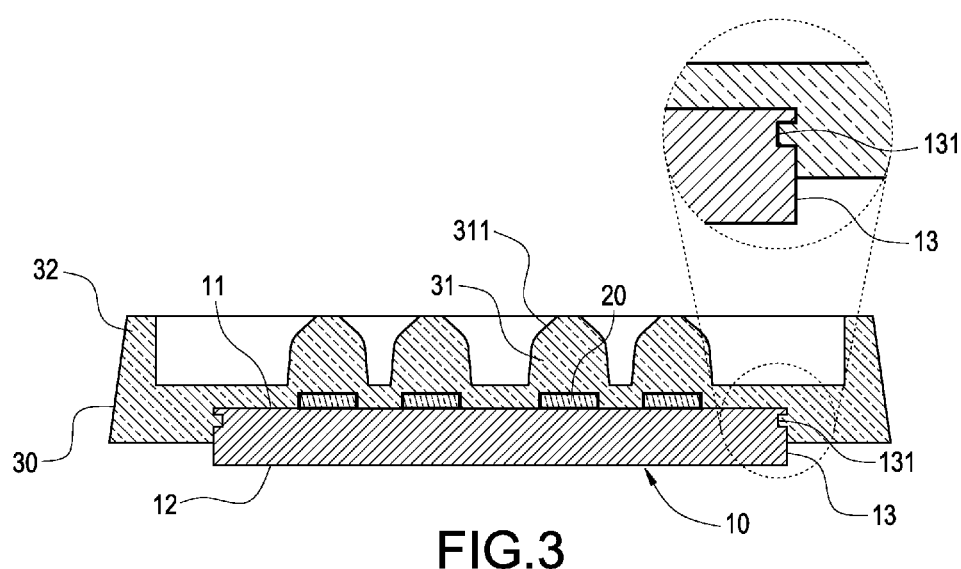
FIG. 3 is an assembled cross-sectional view of the present invention showing the lens covering the respective bare chips.
Figure 4:
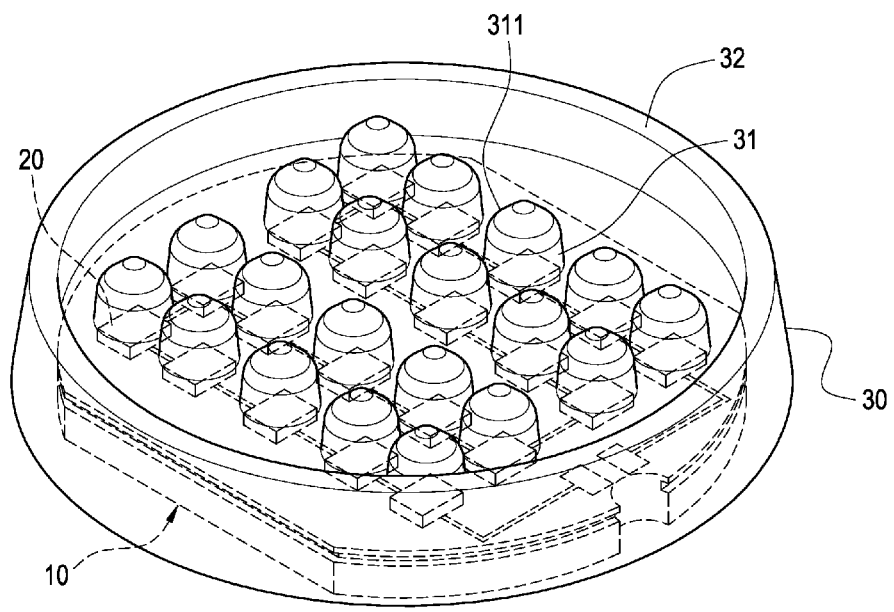
FIG. 4 is a perspective view showing the external appearance of the package structure of the present invention.

Please refer to FIGS. 3 and 4. After arranging the respective LED bare chips 20 on the substrate 10, this combination of the LED bare chips 20 and the substrate 10 are put into a preformed mold (not shown). Then, molten resin is injected into the mold in such a manner that a portion of the molten resin covers the LED bare chips 20, the upper surface 11 of the substrate 10 and the circuit pattern 111, and the other portion of the molten resin flows along the inner walls of the mold to be filled into the groove 131. After the molten resin is cured, a lens 30 is formed. A solid light-guiding post 31 is formed in the lens 30 above a corresponding LED bare chip 20. The light-guiding post 31 is substantially formed into a conical shape. The top of the light-guiding post 31 is formed into a light-converging protrusion 311 for converging the light, thereby increasing the light emitting efficiency. The outer periphery of the light-guiding posts 31 is formed with an annular frame 32.

Figure 5:
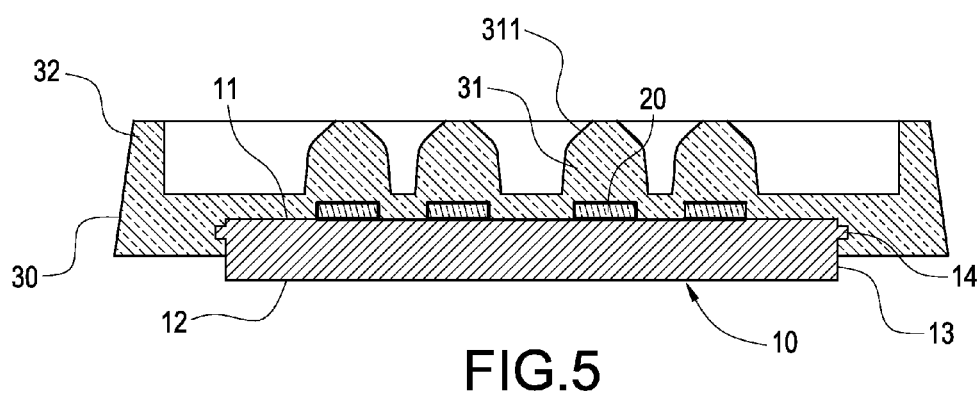
FIG. 5 is an assembled cross-sectional view showing another embodiment of the present invention.

Please refer to FIG. 5. In addition to the above embodiment, the light emitting diode package structure of the present invention can be carried out by another embodiment, in which the side surface 13 of the substrate 10 is formed with an annular flange 14. After the molten resin is injected to the mold, the molten resin covers the LED bare chips 20, the upper surface 11 of the substrate 10 and the circuit pattern 111, and the other portion of the molten resin flows along the inner walls of the mold to be engaged with the annular flange 14. After the molten resin is cured, a lens 30 is formed, and the connecting strength between the lens 30 and the substrate 10 can be enhanced greatly.

What is claimed is:

1. A light emitting diode package structure, including:
    a substrate (10) having an upper surface (11), a lower surface (12) and a side surface (13) between the upper surface (11) and the lower surface (12), the upper surface (11) being provided with a circuit pattern (111), the side surface (13) being provided with a groove (131);
    a plurality of LED bare chips (20) fixed on the upper surface (11) and electrically connected with the circuit pattern (111); and
    a lens (30) covering the LED bare chips (20), the upper surface (11) and the circuit pattern (111) by means of an injection molding process so as to be inserted into the groove (131).

2. The light emitting diode package structure according to claim 1, wherein the substrate (10) is a metallic substrate.

3. The light emitting diode package structure according to claim 2, wherein the circuit pattern (111) is combined on the upper surface (11) of the metallic substrate (10) in an electrical insulating manner.

4. The light emitting diode package structure according to claim 2, wherein a first and a last ends of the circuit pattern (111) are formed with an electrical conducting contact (112) respectively.

5. The light emitting diode package structure according to claim 2, wherein the groove (131) is an annular groove surrounding the profile of the substrate (10).

6. The light emitting diode package structure according to claim 5, wherein a cross section of the groove (131) is formed into any one of a rectangular shape, a trapezoid shape, a V shape, a semicircular shape, a dovetailed shape and a triangular shape.

7. The light emitting diode package structure according to claim 1, wherein a solid light-guiding post (31) is formed in the lens (30) above a corresponding LED bare chip (20), and the light-guiding post (31) is formed into a conical shape.

8. The light emitting diode package structure according to claim 7, wherein a top of the light-guiding post (31) is formed into a light-converging protrusion (311), and a periphery of the light-guiding posts (31) is formed with an annular frame (32).

\* \* \* \* \*